(12) United States Patent
Jung et al.

(10) Patent No.: US 7,776,407 B2
(45) Date of Patent: Aug. 17, 2010

(54) METHOD FOR SURFACE TREATMENT OF SUBSTRATE AND METHOD FOR FORMING FINE WIRING

(75) Inventors: Hyun-Chul Jung, Yongin-si (KR); Jae-Woo Joung, Suwon-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/081,429

(22) Filed: Apr. 16, 2008

(65) Prior Publication Data
US 2008/0311312 A1 Dec. 18, 2008

(30) Foreign Application Priority Data
Jun. 14, 2007 (KR) ..................... 10-2007-0058313

(51) Int. Cl.
*H05H 1/24* (2006.01)
(52) U.S. Cl. ..................... 427/569; 216/71; 216/77; 156/67
(58) Field of Classification Search ................. 427/569; 216/71, 77; 156/67
See application file for complete search history.

(56) References Cited

U.S. PATENT DOCUMENTS

| | | | | | |
|---|---|---|---|---|---|
| 5,397,397 | A | * | 3/1995 | Awad | 134/1 |
| 5,417,769 | A | * | 5/1995 | Gerard et al. | 134/18 |
| 5,789,359 | A | * | 8/1998 | Shimozawa et al. | 510/175 |
| 6,106,659 | A | * | 8/2000 | Spence et al. | 156/345.43 |
| 2006/0174993 | A1 | * | 8/2006 | Bery et al. | 156/67 |
| 2006/0216853 | A1 | * | 9/2006 | Nomoto | 438/99 |

FOREIGN PATENT DOCUMENTS

| | | | | |
|---|---|---|---|---|
| JP | 02012954 | A | * | 1/1990 |
| KR | 2004-0028536 | | | 4/2004 |
| KR | 2005-0032615 | | | 4/2005 |

OTHER PUBLICATIONS

Handbook of Critical Cleaning, B. Kanegsberg, CRC Press, (2000), p. 168) Used Only as Evidence.*
Korean Office Action issued in Korean Patent Application No. KR 10-2007-0058313, issued on Mar. 26, 2008.

* cited by examiner

*Primary Examiner*—Nadine G Norton
*Assistant Examiner*—Mahmoud Dahimene
(74) *Attorney, Agent, or Firm*—McDermott Will & Emery LLP

(57) ABSTRACT

The present invention related to a method for surface treatment and a method for forming fine wiring and more particularly, to a method for surface treatment of a substrate, including: preparing a substrate on which a fine wiring is to be formed; and treating the surface of the substrate with a fluorine containing liquid having a low boiling point, and a method for forming fine wiring using the same method. According to the present invention, not only the spreading of ink droplets but also the deterioration of the interface adhesion is avoided.

2 Claims, No Drawings

METHOD FOR SURFACE TREATMENT OF SUBSTRATE AND METHOD FOR FORMING FINE WIRING

CROSS-REFERENCE TO RELATED APPLICATIONS

This application claims the benefit of Korean Patent Application No. 10-2007-0058313 filed on Jun. 14, 2007, with the Korea Intellectual Property Office, the contents of which are incorporated here by reference in their entirety.

BACKGROUND

1. Technical Field

The present invention related to a method for surface treatment and a method for forming fine wiring.

2. Description of the Related Art

Methods for forming fine wirings in related art are etching resist method and laser method. The etching resist method includes coating on a substrate, pre-coated with a resist which is a conductive layer with a, photosensitive material; exposing and developing a circuit pattern; and etching the conductive layer according to the resist pattern to form a wiring. However, the etching resist method requires large scale facilities and complicate processings, has only several tens of percentages of efficiency in use of materials of which most are thus wastes, increases manufacturing costs, requires forming and removing a resist layer, and eventually does not form a sufficient fine wiring.

The laser method includes forming a water repellent layer on a substrate; removing a part of the water repellent layer by laser light; and spraying conductive ink to the part where the water repellent layer is removed to form a conductive wiring. However, this method increases manufacturing costs and is complicate and inefficient due to additional use of a laser light generating device and additional forming and removing steps of the water repellent layer.

Accordingly, an inkjet method is recently introduced for forming a fine wiring on a substrate which has several advantages including a selective formation of fine wirings. A method, including coating a substrate with a liquid, in which conductive fine particles are dispersed, by an ink-jet method and forming a conductive pattern by the heat-treatment or the laser exposure, has been recently introduced. This method reduces significantly manufacturing processes and amount of materials to be used since the photolithography is not any more required.

However, until now it still has problems such as spreading of ink droplets and deterioration of the interface adhesion between a droplet and a substrate. A degree of spreading of ink droplets is depending on a diameter of the droplet ejected from an ink-jet head nozzle, the surface tension of ink and the surface energy of a substrate. There is a limitation to reduce a size of the head nozzle of an ink-jet and spreading of ink droplets since a certain amount of metal nanoparticles is contained in the ink to form a conductive wiring. Further a material used for preventing the spreading of ink droplets has low surface energy and thus is not mixed well with other compounds. When the surface of a substrate is treated for preventing the spreading of droplets, it deteriorates the interface adhesion. On the other hand, when the surface treatment is performed for improving the interface adhesion, it increases the spreading of ink droplets.

Therefore, a great deal of development researches is currently under way on methods for improving the interface adhesion with a substrate and forming finer wirings which are highly demanded for the smaller, lighter, and thinner electric components.

SUMMARY

The present invention is to provide a method for surface treatment of a substrate which lowers temporarily the surface energy of a substrate and thus prevents the spreading of ink droplets and deterioration of the interface adhesion at the same time.

The present invention is further to provide a method for forming a fine wiring by employing the surface treatment method of a substrate.

One aspect of the invention provides a method for surface treatment of a substrate, including: preparing a substrate on which a fine wiring is to be formed; and treating the surface of the substrate with a fluorine containing liquid having a low boiling point.

According to an embodiment of the invention, the boiling point of the liquid may be in the range of 0° C. to 70° C. and an example may be at least one chosen from chlorofluorocarbon (CFC), hydrochlorofluorocarbon (HCFC), and hydrofluorocarbon (HFC).

According to an embodiment of the invention, the method may further include performing hydrophilic surface treatment prior to the step of treating the surface of the substrate with a liquid having a low boiling point. Here, the hydrophilic surface treatment may be a plasma treatment under oxygen or halogen atmosphere but it is not limited to this.

According to another embodiment of the invention, a method for forming a fine wiring is provided including: performing the surface treatment of a substrate by the above-described method; and forming a metal wiring on the surface of the substrate before the liquid with a low boiling point is evaporated.

DETAILED DESCRIPTION

Hereinafter, the method for surface treatment of a substrate and the method for forming a fine wiring according to the invention will be described in more detail.

When a fine wiring is formed by a conventional method, there are some problems including spreading of ink droplets and deterioration of the interface adhesion between a droplet and a substrate in the print technique of conductive ink.

The spreading of ink droplets may depend on a diameter of an ink droplet ejected, the surface tension of ink and the surface energy of a substrate. But since a certain amount of metal nanoparticles has to be included in order to form a conductive wiring, there is a limitation to reduce a size of a nozzle of an ink-jet head and a degree of spreading of droplets. Further, a material used for preventing such spreading has a lower surface energy and thus deteriorates its combination with other compounds.

Therefore, the present invention is to lower the surface energy of a substrate and thus prevents not only the spreading of ink droplets but also the deterioration of the interface adhesion.

According to an embodiment of the present invention, when a lyophilic treatment is performed on the surface of a substrate by using a fluorine-containing liquid having a low boiling point, this liquid having a low boiling point evaporates easily and is chemically stable, so that the surface energy can be lowered since the liquid does not easily react with the surface of a substrate and the adhesion between ink and a substrate cannot be affected sine the substrate is returned to one as it was after the liquid is evaporated.

The fluorine containing liquid having a low boiling point used to lower the surface energy in the present invention may have 0° C. to 70° C. of the boiling point. If it is lower than 0° C., it may be costly to maintain the temperature of the substrate at a lower than the boiling point. On the other hand, if it exceeds 70° C., it needs to heat the substrate to evaporate the liquid. A boiling point of the liquid may be lower than a room temperature.

According to an embodiment of the invention, examples of the fluorine containing liquid include chlorofluorocarbon (CFC), hydro chlorofluorocarbon (HCFC), and hydro fluorocarbon (HFC), etc but it is not limited to them. The liquid may be used alone or as a combination of at least two.

Chlorofluorocarbon may include CFC-11, CFC-12 and CFC-13, etc., hydrochlorofluorocarbon may include HCFC-22, HCFC-123, HCFC-124, HCFC-141b, HCFC-142b, HCFC-225a and HCFC-225ca, etc., and hydrofluorocarbon may include HFC-32, HFC-125, HFC-134a, and HFC-152a, etc., but each is not limited to them.

The fluorine containing liquid may be treated on the surface of a substrate by various methods including dipping, spraying, and printing.

When the fluorine containing liquid is treated on the surface of a substrate, it shows water repellent property only right after the surface treatment but it does not affect the substrate after the liquid evaporates since the liquid evaporates within a short period of time due to a low boiling point. Thus, it may prevent spreading of ink droplets by reducing the surface energy of the substrate and at the same time, not affect to the interface adhesion between ink droplets and the substrate since the liquid evaporates easily without reacting with the substrate Further, a hydrophilic treatment may be performed prior to the surface treatment described above in order to improve the interface adhesion of an ejected ink droplet.

The hydrophilic treatment may be an exposure of 170-400 nm UV light. This may partially or entirely destruct the water repellent layer which is already formed and thus alleviate the water repellent property. A degree of alleviation of the water repellent property may be controlled with exposing time of UV light, intensity or frequency of UV light, or combination with heat treatment, etc. Here, when UV light is exposed with a mask, it may also reduce the water repellent property. The mask may include a material, which can accelerate a patterning time, such as titan (Ti). The hydrophilic treatment may be performed by using this mask to reduce the water repellent property.

The hydrophilic treatment may be a plasma treatment under oxygen or halogen atmosphere. This may partially or entirely uniformly deteriorate the water repellent layer which is already formed and thus alleviate the water repellent property.

Another method of the hydrophilic treatment may be an exposure of a substrate under ozone atmosphere. This may partially or entirely deteriorate the water repellent layer which is already formed and thus alleviate the water repellent property. Such alleviations of the water repellent property may increase the interface adhesion.

Thus, when the hydrophilic treatment is performed along with the surface treatment of the present invention, both improvement of the interface adhesion and prevention of spreading of ink droplets may be obtained at the same time. That is, the hydrophilic surface treatment increases a slope of an ink droplet to the substrate surface and improves the interface adhesion of the surface and when this surface is treated with a fluorine containing liquid having a low boiling point, the spreading of ink droplets is avoid due to a temporally effect of the fluorine containing liquid having a low boiling point, so that after the liquid is evaporated, not only the increase of a slope of an ink droplet to the substrate surface and improvement of the interface adhesion of the surface but also the prevention of spreading may be obtained.

Another aspect of the present invention is provided a method for forming a fine wiring, including: performing the surface treatment of a substrate according to the above described method; and forming a metal wiring on the surface treated substrate before the liquid having a low boiling point is evaporated.

According to the present invention, it is possible to form a fine wiring on the surface treated substrate before the liquid having a low boiling point is evaporated. Here, the efficiency of the present invention may be optimized when an ink-jet printer is used to perform the surface treatment of the present invention right before forming a metal wiring and eject metal ink.

When the conventional ink-jet method is used, ink droplets ejected from a head nozzle spread more than 3 times on the surface where any surface treatment is not performed, so that there is limitation to form a fine wiring. Ink-jet heads commercially available currently eject about 10 to 30 pl of an ink droplet of which a diameter is about 27 to 39 μm, so that it is difficult to form a fine wiring of less than 100 μm. Thus, it is highly required to prevent the spreading of ink droplets when the ink is ejected by employing the ink-jet method in order to form a fine wiring. However, the spreading and the interface adhesion of ink droplet and substrate are contrary to each other since when any surface treatment is performed to avoid spreading of ink droplets, most of the interface adhesion between wiring and the substrate is decreased. Therefore, the present invention provides a temporary surface treatment which prevents spreading of ink droplets and maintains the interface adhesion since after printing, the liquid used for the surface treatment is evaporated.

Hereinafter, although more detailed descriptions will be given by examples, those are only for explanation and there is no intention to limit the invention.

EXAMPLE 1

A polyamide substrate having a thickness of 51 μm was dipped into a CFC solvent (Novec HFE-700, 3M) at an ambient temperature. Before the CFC solvent on the polyamide substrate was dried out, a non-aqueous ink of tetradecane including silver nanoparticles of 20 nm was dropped on the substrate by using a 35 micrometer pipette. Here the 35 micrometer pipette was used instead of using an ink-jet to eject the tetradecane non-aqueous solvent on the polyamide substrate for an experimental convenience. A droplet ejected had a diameter of 3.5 mm.

COMPARISON EXAMPLE

Silver nano ink used in Example 1 was dropped on a polyamide substrate having a thickness of 51 μm to which any surface treatment is not performed by using a 35 micrometer pipette as in Example 1. A droplet ejected had a diameter of 8 mm.

Referring to the example and the comparison example, it is noted that size of the droplet dropped on the surface treated polyamide substrate is about 2.3 times smaller. Having a smaller size of the droplet increases a contact angle between the substrate and the droplet, so that it prevents spreading of ink droplets.

After dipping in the CFC solvent, the solvent was dried within a minute and size and shape of the ink droplet each was maintained after drying. Therefore, it was possible to form a fine wiring without affecting the interface adhesion between the substrate and the ink droplet.

As described above, the method for surface treatment according to the present invention prevents spreading of droplets by lowering the surface energy of a substrate. Further, since this solvent has a low boiling point and thus is evaporated within a short period of time, the surface of the substrate is not affected at all and the interface adhesion is not deteriorated. Both prevention of spreading of ink droplets and maintaining the interface adhesion allow the formation of a fine wiring.

While the present invention has been described with reference to particular embodiments, it is to be appreciated that various changes and modifications may be made by those skilled in the art without departing from the spirit and scope of the present invention, as defined by the appended claims and their equivalents.

What is claimed is:

1. A method for forming a fine wiring, the method comprising:
    performing the pre-treatment of a surface of a substrate for forming fine wirings on the substrate,
    wherein the pre-treatment comprises:
    preparing the substrate to form a fine wiring; and
    treating the surface of the substrate with a fluorine containing liquid having a boiling point in the range of 0° C. to 70° C. by way of dipping, spraying or printing in order to temporarily lower a surface energy of the substrate from an original surface energy of the substrate until the fluorine containing liquid has a boiling point of 0° C. to 70° C. evaporates; and
    forming a metal wiring on the surface-treated substrate with ink-jetting of ink compositing containing metal nano particles before the liquid having a boiling point of 0° C. to 70° C. evaporates.

2. A method for forming a fine wiring, the method comprising:
    performing a pre-treatment of a surface of a substrate for forming fine wirings on the substrate, wherein the pre-treatment comprises:
    preparing the substrate to form a fine wiring; and
    treating the surface of the substrate with a fluorine containing liquid having a boiling point in the range of 0° C. to 70° C. by way of dipping, spraying or printing in order to temporarily lower a surface energy of the substrate from an original surface energy of the substrate until the fluorine containing liquid has a boiling point of 0° C. to 70° C. evaporates; and
    performing a hydrophilic surface treatment prior to the step of treating the substrate with a fluorine containing liquid having a boiling point of 0° C. to 70° C.
    forming a metal wiring on the surface-treated substrate with ink jetting of ink compositing containing metal nano particles before the liquid having a boiling point of 0° C. to 70° C. evaporates.

* * * * *